United States Patent
Winkler

(10) Patent No.: US 11,232,924 B2
(45) Date of Patent: Jan. 25, 2022

(54) METHOD OF OPERATING A CHARGED PARTICLE GUN, CHARGED PARTICLE GUN, AND CHARGED PARTICLE BEAM DEVICE

(71) Applicant: ICT Integrated Circuit Testing Gesellschaft für Halbleiterprüftechnik mbH, Heimstetten (DE)

(72) Inventor: Dieter Winkler, Munich (DE)

(73) Assignee: ICT Integrated Circuit Testing Gesellschaft für Halbleiterprüftechnik mbH, Hemstetten (DE)

( * ) Notice: Subject to any disclaimer, the term of this patent is extended or adjusted under 35 U.S.C. 154(b) by 0 days.

(21) Appl. No.: 17/075,905

(22) Filed: Oct. 21, 2020

(65) Prior Publication Data
US 2021/0241990 A1  Aug. 5, 2021

Related U.S. Application Data

(62) Division of application No. 16/777,276, filed on Jan. 30, 2020, now Pat. No. 10,861,666.

(51) Int. Cl.
*H01J 3/02* (2006.01)
*H01J 37/073* (2006.01)

(52) U.S. Cl.
CPC ............ *H01J 3/021* (2013.01); *H01J 37/073* (2013.01); *H01J 2203/026* (2013.01); *H01J 2229/481* (2013.01); *H01J 2229/4824* (2013.01); *H01J 2229/4834* (2013.01)

(58) Field of Classification Search
CPC .... H01J 3/021; H01J 37/073; H01J 2203/026; H01J 2229/4824; H01J 2229/4834; H01J 2229/481
See application file for complete search history.

(56) References Cited

U.S. PATENT DOCUMENTS

| 4,621,213 A | 11/1986 | Rand |
| 4,625,150 A * | 11/1986 | Rand ...................... H01J 35/153 315/111.31 |
| 8,890,066 B1 * | 11/2014 | Gotkis ................... H01J 37/244 250/306 |
| 10,861,666 B1 | 12/2020 | Winkler |

(Continued)

OTHER PUBLICATIONS

U.S. Appl. No. 16/777,276 Restriction Requirement dated Jun. 15, 2020, 5 pages.

(Continued)

*Primary Examiner* — Donald L Raleigh
(74) *Attorney, Agent, or Firm* — Kilpatrick Townsend & Stockton LLP

(57) ABSTRACT

A charged particle gun for a charged particle beam device is described. The charged particle gun includes a gun housing; an emitter provided in the gun housing, the emitter being configured to emit a charged particle beam along an axis; an emitter power supply connected to the emitter; a trapping electrode provided in the gun housing, the trapping electrode at least partially surrounding the axis; a trapping power supply connected to the trapping electrode; and a shielding element shielding an electrostatic field of the trapping electrode from the axis during operation of the gun housing.

16 Claims, 5 Drawing Sheets

(56) References Cited

U.S. PATENT DOCUMENTS

| | | | |
|---|---|---|---|
| 2001/0024091 A1* | 9/2001 | Tsuida | H01J 25/34 |
| | | | 315/3.5 |
| 2014/0264019 A1‡ | 9/2014 | Adamec | H01J 3/027 |
| | | | 250/310 |
| 2019/0193192 A1* | 6/2019 | Fager | B23K 15/0046 |
| 2019/0237288 A1‡ | 8/2019 | Platzgummer | H01J 37/1477 |
| 2020/0194223 A1* | 6/2020 | Jiang | H01J 37/28 |

OTHER PUBLICATIONS

U.S. Appl. No. 16/777,276 Notice of Allowance dated Jul. 29, 2020, 9 pages.
International Search Report for Application No. PCT/EP2021/050164, dated Apr. 1, 2021, 7 pages.
Written Opinion for Application No. PCT/EP2021/050164, dated Apr. 1, 2021, 10 pages.

\* cited by examiner
‡ imported from a related application

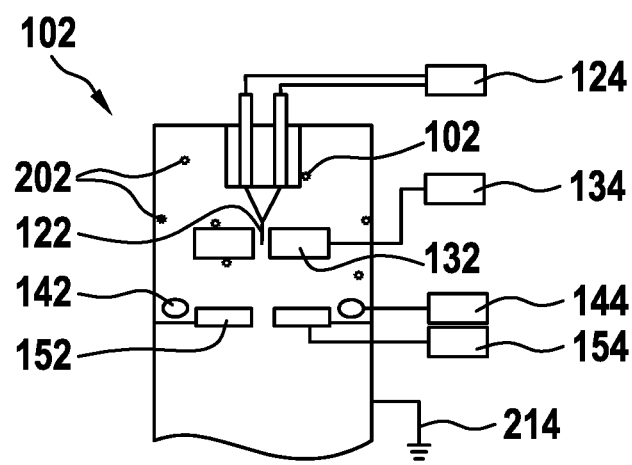
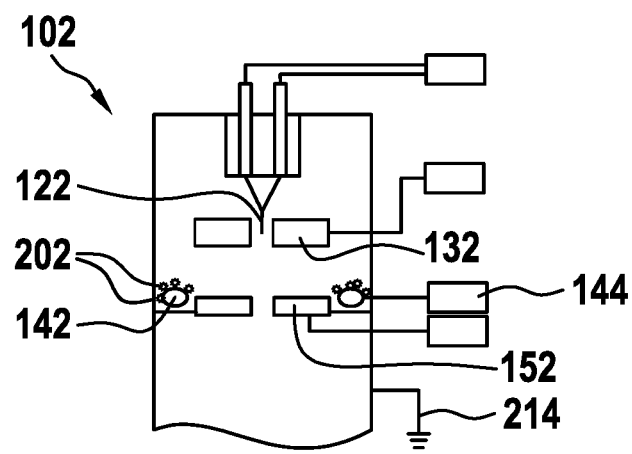
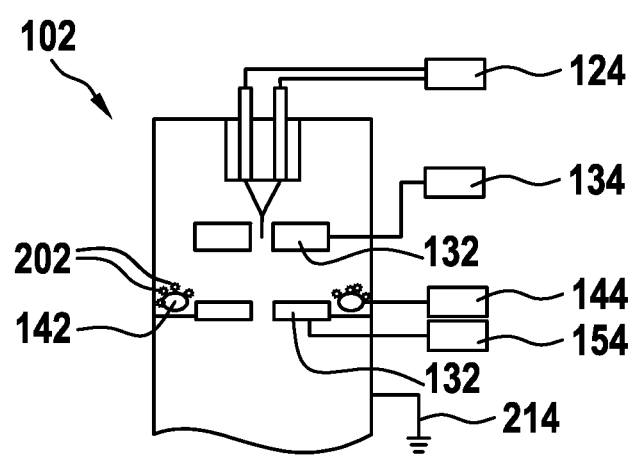

METHOD OF OPERATING A CHARGED PARTICLE GUN, CHARGED PARTICLE GUN, AND CHARGED PARTICLE BEAM DEVICE

CROSS-REFERENCES TO RELATED APPLICATIONS

The present application is a division of U.S. application Ser. No. 16/777,276, filed Jan. 30, 2020, the entire contents of which are incorporated by reference herein for all purposes.

FIELD

Embodiments of the present disclosure relate to a particle trap for a charged particle beam device, particularly a particle trap for an ultra-high vacuum (UHV) gun chamber. Further, embodiments relate to a charged particle gun or a gun chamber and a charged particle beam device. Embodiments also relate to cleaning of a charged particle beam device, for example, cleaning of a charged particle gun or a gun chamber of a charged particle beam device. Embodiments particularly relate to a method of operating a charged particle gun, a charged particle gun, and a charged particle beam device.

BACKGROUND

Charged particle beam devices have many functions in a plurality of industrial fields, including, but not limited to, electron beam inspection (EBI), critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to the short wavelengths.

For operation of a charged particle beam device in the field, i.e. according to industrial standards, ramping up of a system and maintenance of the system is to be considered. Particularly, the overall throughput of the system is influenced by downtimes. Accordingly, a fast and reliable start of operation of the system is beneficial. For a first start or after maintenance, dust particles may remain in the charged particle beam device, for example, the gun chamber, even after careful cleaning. Particularly in the gun chamber, particles may cause arcing and destruction of the emitter.

Presently, time consuming cleaning is provided and several attempts to bias the emitter may be provided. After an arc, the gun chamber may be opened again and may be re-inspected to discover and remove remaining particles.

In view of the above, improved methods of operating a charged particle gun or a gun chamber of a charged particle beam device and an improved charged particle gun and an improved charged particle beam device is beneficial.

SUMMARY

In light of the above, a method of operating a charged particle gun, a charged party gun and a charged particle beam device according to the independent claims are provided. Further aspects, advantages, and features are apparent from the dependent claims, the description, and the accompanying drawings.

According to one embodiment, a method of operating a charged particle gun is provided. The method includes providing an emitter at a first emitter potential within the charged particle gun and providing a trapping electrode at a first electrode potential within the charged particle gun, wherein the first emitter potential and the first electrode potential is provided to have an electrical field of essentially zero at the emitter and at the trapping electrode; switching the trapping electrode from the first electrode potential to a second electrode potential different from the first electrode potential to generate an electrostatic trapping field at the trapping electrode; and after switching the trapping electrode from the first electrode potential to the second electrode potential, switching on an electrostatic emission field at the emitter.

According to one embodiment, a charged particle gun for a charged particle beam device is provided. The charged particle gun includes a gun housing; an emitter provided in the gun housing, the emitter being configured to emit a charged particle beam along an axis; an emitter power supply connected to the emitter; a trapping electrode provided in the gun housing, the trapping electrode at least partially surrounding the axis; a trapping power supply connected to the trapping electrode; and a shielding element shielding an electrostatic field of the trapping electrode from the axis during operation of the gun housing.

According to one embodiment, a charged particle beam device is provided. The charged particle beam device includes a charged particle gun according to any of the embodiments described herein; and a charged particle beam column for guiding charged particles on a specimen.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 2A to 2C show a schematic view of a portion of a charged particle beam device illustrating operations to trap particles according to further embodiments described herein;

DETAILED DESCRIPTION OF EMBODIMENTS

Figure 1A:
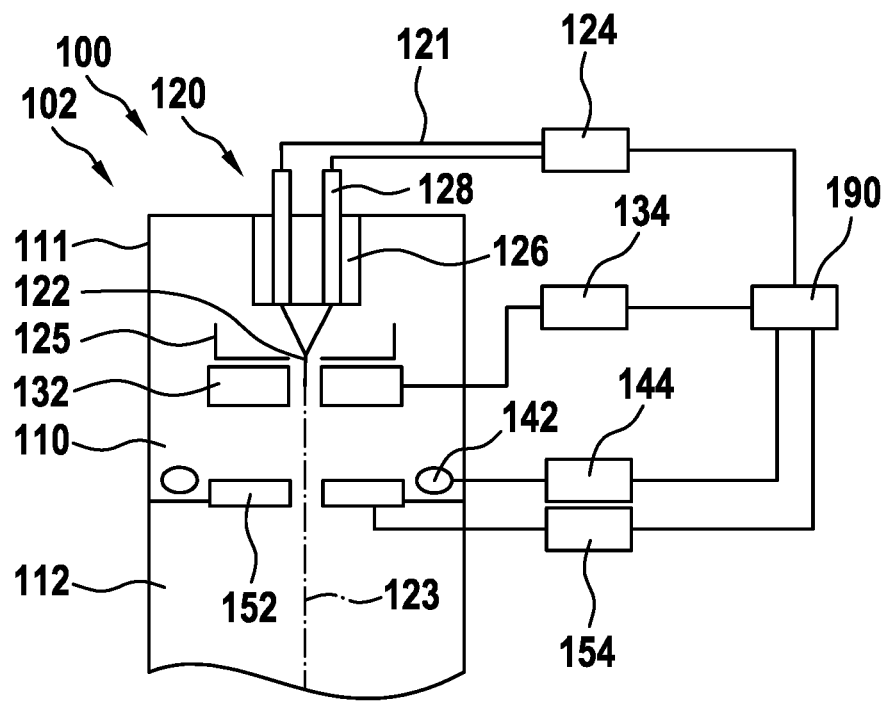
FIG. 1A shows a schematic view of a portion of a charged particle beam device according to embodiments described herein and including an electrode for trapping particles.

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (also referred to as "primary charged particle beam"), signal charged particles, such as secondary electrons (SE), are created, which may carry information about the topography, chemical constituents and/or electrostatic potential of the sample and others. The secondary electrons can include at least one of backscattered electrons, secondary electrons and Auger electrons.

Charged particle beam devices are operated under a high vacuum. Particularly the charged particle gun including the emitter may be operated at ultrahigh vacuum (UHV) pressures. For operation of the emitter, a high voltage is applied while the gun housing is at ultrahigh vacuum pressure. Various cleaning procedures are applied before and during evacuation of the gun housing. After an initial pumping down of the gun housing, i.e. the UHV chamber of the charged particle gun, particles such as dust particles can remain in the chamber or housing of the charged particle gun.

The tip of the emitter releases charged particles, for example, electrons. According to some embodiments, which can be combined with other embodiments described herein, charged particles emitted by the emitter can be electrons or ions. In the following, reference will be made to charged particles being electrons. For example, a charged particle beam device can be a scanning electron microscope having a single beam or having multiple beamlets. However, similar embodiments can be provided for charged particles being ions. It is noted that embodiments describing potentials for an electron beam device will utilize potentials of a different polarity in the case of an ion beam device.

Particles that may remain in the gun housing of the charged particle gun may adhere to the tip of the emitter, particularly when the emitter voltage is switched on. This small radius of curvature of the tip of the emitter results in high field strength at the emitter that may further increase the likelihood of particles being adhered to the emitter. For example, particles such as dust particles can be electrostatically attracted to the negatively biased emitter. Further, particles at the emitter tip may result in arcing and even destruction of the emitter. Arcing at the emitter can be triggered by the even further increased field strengths of the particles, such as dust particles, adhered to the emitter. Thus, as soon as arcing is detected during ramping up of the charged particle gun, i.e. applying inter alia the operation potential to the emitter, ramping up of the system is stopped and further cleaning measures may be applied. Cycles of attempting to ramp up the charged particle gun and additional cleaning can be time-consuming, for example, during installation of a new system or after maintenance of an existing system.

Embodiments of the present disclosure provide a particle trap for particles, such as dust particles, in a vacuum chamber, particularly in a UHV chamber, such as the gun housing of the charged particle gun, which houses the emitter. The particle trap can reduce or avoid arcing in the UHV charge parted gun, for example, an electron gun, particularly a UHV electron gun.

According to some embodiments of the present disclosure, an electrode is provided in the gun housing and a voltage is applied to the electrode before switching on the emitter located in the gun housing. Accordingly, particles remaining in the gun housing, for example, dust particles dispersed in the UHV chamber of the charged particle gun, i.e. the gun housing, are electrostatically attracted to the electrode. The particles remain attracted at the electrode. Only thereafter operating voltages for the charged particle gun, and particularly operating voltages for the emitter are applied.

In light of the above, embodiments of the present disclosure allow for faster ramp-up of the charged particle gun. Additionally or alternatively, the risk of arcing and emitter destruction during ramping up of the charged particle gun is reduced.

FIG. 1A shows a portion of a charged particle beam device 100. The charged particle beam device 100 includes the charged particle gun 102. The charged particle beam device further includes the charged particle source 120. The charged particle source 120 includes the emitter 122 and the emitter power supply 124. Voltages for biasing the emitter 122 can be provided by the power supply with conductors 121. For example, high voltages can be provided into the vacuum chamber 110 of the charged particle gun 102 with conductors 128 supported by an insulator 126. The charged particle gun 102 includes the vacuum chamber 110 provided by the gun housing 111. The emitter 122 is provided within the gun housing 111, i.e. within the vacuum chamber 110. For control of the electron beam generated by the charged particle source, the emitter voltage of the emitter 122 can be controlled by the emitter power supply 124. The electron beam can further be controlled by the suppressor electrode 125, the extractor 132, and the anode 152.

The extractor potential of the extractor 132 can be controlled by the extractor power supply 134. The anode potential of the anode 152 can be controlled by the anode power supply 154. For example, the anode 152 can be provided between the vacuum chamber 110 and a further vacuum chamber 112 of the column of the charged particle beam device 100. According to some embodiments, the anode can be provided at least partially within the gun housing 111.

According to embodiments of the present disclosure, a trapping electrode 142 is provided in the gun housing 111. A trapping power supply 144 is connected to the trapping electrode for biasing the trapping electrode. An electron beam emitted from the emitter 122 travels essentially along the axis 123. According to some embodiments, which can be combined with other embodiments described herein, the trapping electrode at least partially surrounds the axis 123.

According to one embodiment, a charged particle gun for a charged particle beam device is provided. The charged particle gun 102 includes a gun housing and an emitter provided in the gun housing. The emitter can be configured to emit a charged particle beam along an axis 123. The charged particle gun 102 further includes an emitter power supply connected to the emitter. A trapping electrode is provided in the gun housing, the trapping electrode at least partially surrounding the axis. A trapping power supply is connected to the trapping electrode. The charged particle gun 102 further includes a shielding element shielding the potential provided from the trapping power supply to the trapping electrode from the axis during operation of the gun chamber.

According to some embodiments, which can be combined with other embodiments described herein, the emitter can be a field emitter, for example, the thermal field emitter (TFE), such as a Schottky emitter, or a cold field emitter (CFE). Embodiments of the present disclosure may be particularly advantageous for CFEs, since a CFE may be even more sensitive to arcing that can result in destruction of the emitter.

Figure 1B:
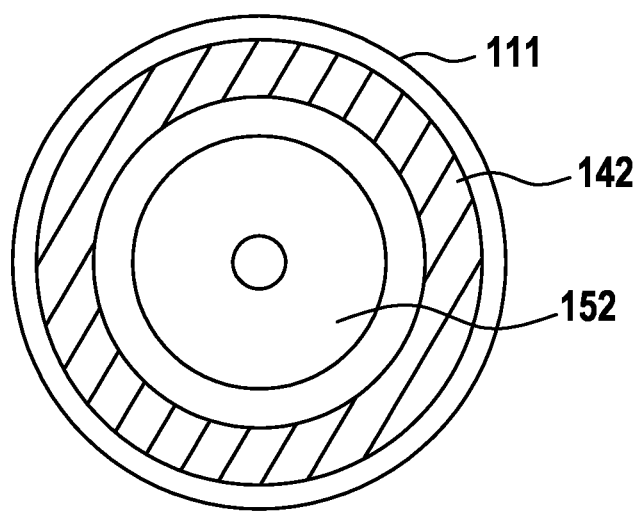
FIG. 1B shows the cross-sectional view of the portion of the charged particle beam device shown in FIG. 1A.

In the exemplary embodiment of FIG. 1A, the shielding element can be provided by the anode 152. This may also be seen in the cross-sectional schematic view of FIG. 1B. FIG. 1B illustrates a cross-sectional view showing the gun housing 111, the trapping electrode 142 and the anode 152. The trapping electrode 142 surrounds the anode 152. The anode 152 shields potentials of the trapping electrode 142 from the center of the rotationally symmetric arrangement shown in FIG. 1B.

According to embodiments of the present disclosure, the shielding element reduces or avoids influence of the potential of the trapping electrode on an electron beam traveling along the axis 123. According to yet further additional or alternative modifications, the trapping electrode can be rotationally symmetric, and particularly ring-shaped. For example, the rotational symmetry can be provided around the axis 123. Accordingly, a potentially remaining influence of the trapping electrode potential on the electron beam can be provided in a symmetric manner. According to yet further optional implementations, the charged particle gun may further include an extractor electrode within the gun housing, a suppressor electrode within the gun housing, and an anode at least partially within the gun housing, as shown in FIG. 1A.

According to some embodiments, which can be combined with other embodiments described herein, the charged particle gun 102 and/or the charged particle beam device 100 can include a controller 190. As illustrated in FIG. 1A, the controller 190 can be connected to the emitter power supply 124, the extractor power supply 134, the trapping power supply 144, and the anode power supply 154. According to some embodiments, which can be combined with other embodiments described herein, the controller 190 can be connected to one or more of the power supplies of the charged particle beam device and/or the charged particle gun to control operation of the charged particle beam.

According to some embodiments, which can be combined with other embodiments described herein, the charged particle gun includes a controller having a processor and a memory storing instructions that, when executed by the processor, cause the apparatus to perform a method according to any of the embodiments of the present disclosure.

According to some embodiments, which can be combined with other embodiments described herein, a charged particle beam device may further include substrate support (not shown in FIG. 1A), and particularly the substrate support connected to a power supply for providing a specimen voltage during operation of the charged particle beam device. The controller 190 may also control the specimen potential. Accordingly, the landing energy of the electrons on the specimen can be controlled by the potential difference between the specimen and the emitter 122.

The controller 190 comprises a central processing unit (CPU), a memory and, for example, support circuits. To facilitate control of the charged particle beam device and/or the charged particle gun, the CPU may be one of any form of general purpose computer processors that can be used in an industrial setting for controlling various chambers and sub-processors. The memory is coupled to the CPU. The memory, or a computer readable medium, may be one or more readily available memory devices such as random access memory, read only memory, floppy disk, hard disk, or any other form of digital storage either local or remote. The support circuits may be coupled to the CPU for supporting the processor in a conventional manner. These circuits include cache, power supplies, clock circuits, input/output circuitry and related subsystems, and the like. Imaging process instructions and/or instructions for operating and cleaning the charged particle beam device (or a charged particle gun, respectively) are generally stored in the memory as a software routine typically known as a recipe. The software routine may also be stored and/or executed by a second CPU (not shown) that is remotely located from the hardware being controlled by the CPU. The software routine, when executed by CPU, transforms the general purpose computer into a specific purpose computer (controller) that controls the apparatus operation such as that for controlling inter alia the one or more power supplies of the charged particle beam device and/or the charged particle gun. Although the method and/or process of the present disclosure is discussed as being implemented as a software routine, some of the method steps that are disclosed therein may be performed in hardware as well as by the software controller. As such, the embodiments may be implemented in software as executed upon a computer system, and in hardware as an application specific integrated circuit or other type of hardware implementation, or a combination of software and hardware. The controller may execute or perform a method of operating a charged particle gun or a method of operating the charged particle beam device according to embodiments of the present disclosure.

Embodiments allow for arc protection of an electron gun, for example, the electron gun of a scanning electron microscope (SEM). Due to particle trapping, the need to further reduce particle contamination can be reduced. Further, the risk of arcing, for example, after maintenance of an electron gun, when operating the emitter in the UHV environment can be reduced.

According to embodiments of the present disclosure, the trapping electrode provides an additional electrode in the gun housing 111. That is, an electrode in addition to the electrodes serving for charged particle beam guiding or charged particle beam influencing is introduced. The electrodes serving for charged particle beam guiding may be selected from the group consisting of: a suppressor, an extractor, an anode, an electrode of a lens, an electrode of a deflector for the charged particle beam, and an electrode of a beam aberration correction element. For example, the additional electrode or trapping electrode can be a ring electrode. According to some embodiments, which can be combined with other embodiments described herein, the trapping electrode can be provided at the bottom of the vacuum chamber 110 or the gun housing 111, or in close proximity to the emitter, respectively.

For operation of the charged particle gun or the charged particle beam device, respectively, the trapping electrode is biased to a positive potential or a negative potential, for example, plus or minus a few hundred volts to a few kV, to attract contaminating particles. An electrostatic trapping field is generated at the trapping electrode. The trapping electrode is switched to the potential before switching on the high voltage to operate the emitter or gun, respectively. Thereafter, in a second step the other voltages of the charged particle gun are switched on. An electrostatic emission field at the emitter is generated after the electrostatic trapping field is generated. According to some embodiments, which can be combined with other embodiments described herein, the direction of the electrostatic trapping field remains the same at the trapping electron upon switching on the electrostatic emission field. The particles absorbed at the trapping electrode remain on the trapping electrode. The danger of arcing is reduced.

According to some embodiments, which can be combined with other embodiments described herein, after maintenance or before ramping up the operation of the charged particle gun, there is no electrical field at the emitter and/or in the charged particle gun. The electric field is essentially zero. The first electric or electrostatic field that is provided in the charged particle gun, for example, within the gun housing and/or adjacent to the emitter, is the electrostatic trapping field. Only thereafter, further electrostatic fields such as the electrostatic emission field is provided in the charged particle gun or the gun housing, respectively. The direction of the electrostatic trapping field at the trapping electrode maintains upon adding the further electrostatic fields. Accordingly, particles remain at the trapping electrode.

FIGS. 2A to 2C illustrate the charged particle gun 102 during the operations of the method of operating the charged particle gun illustrated in the flowchart shown FIG. 6. At operation 602, the voltages within the charged particle gun 102 are at non-operation values. For example, an electrical field is essentially zero at the emitter and at the trapping electrode. The non-operation values can, for example, be the same values as during maintenance or as during pumping down the vacuum chamber 110. For example, the emitter 122, the extractor 132, the anode 152, and that trapping electrode 142 can be on ground potential. In the example illustrated in FIGS. 2A to 2C, also the charged particle beam column is at ground potential as indicated by reference 214. The emitter power supply 124, the extractor power supply 134, the anode power supply 154, and the trapping power supply 144 can, for example, be switched off. After cleaning of the gun housing, i.e. the vacuum chamber of the charged particle gun 102, to reduce contamination inside the gun housing, particles 202 can remain in the vacuum chamber.

According to some embodiments, which can be combined with other embodiments described herein, particles 202 can be dust particles or other contamination particles, that may adhere to the tip of the emitter 122 when not being trapped.

At operation 604 the trapping electrode is switched on. Providing a voltage to the trapping electrode 142 with the trapping power supply 144, generates an electrostatic trapping field attracting the particles 202 towards the trapping electrode 142. This is illustrated in FIG. 2B. For example, for an electron beam gun, the voltage applied to the trapping electrode 142 can be plus or minus several hundreds volts to kilovolts, for example, 100 V to 9 kV or −100 V to −9 kV, such as about −6 kV. One or more of the other components of the charged particle gun are not yet switched to operating voltage for the trapping of the particles. The electrostatic trapping field is the only field in the gun chamber. Particularly, the emitter and/or the extractor are not yet at operating voltage and may, for example, be biased to ground potential. Switching of the trapping electrode causes particles in the gun housing to be attracted to the trapping electrodes and away from the emitter. Additionally or alternatively, switching the trapping electrode causes particles to be attracted to the trapping electrode and away from other components in the gun chamber, particularly other components that may increase arcing when particles are adhered thereto. Such components may be other electrodes or beam guiding elements such as the anode, the suppressor, lens electrodes, or components of the gun housing.

During operation of a charged particle gun or a charged particle beam device, one or more components may be biased to ground potential even though an electrostatic emission field is provided at the emitter. Further, a plurality of components may be biased to ground potential during maintenance. Accordingly, an overlap between maintenance voltages and operating voltages may exist and the components that are, for example, biased to ground potential during operation, may also be on ground potential during operation 604, i.e., when the trapping electrode is switched on. According to some embodiments of the present disclosure, no electrical field is provided at the emitter and/or in the charged particle gun. The electric field can be essentially zero. The first electric or electrostatic field that is provided in the charged particle gun, for example, within the gun housing and/or adjacent to the emitter, is the electrostatic trapping field. Only thereafter, further electrostatic fields such as the electrostatic emission field is provided in the charged particle gun or the gun housing, respectively. According to some embodiments, which can be combined with other embodiments described herein, the trapping electrode 142 is switched to the second electrode potential for trapping of the particles, while not all other components are at operation voltages or a majority of the components are not at operation voltages. Particularly, the trapping electrode can be switched to the second electrode potential for generating the electrostatic trapping potential for trapping of the particles while only one further component of the charged particle gun may potentially be at the operating voltage (e.g. ground) of the one further component, wherein no further electric field is provided by the operating potential (e.g. ground). More particularly, the operating voltage of the one further component may be at ground potential.

At operation 606, one or more of the remaining components, and particularly the emitter 122, is switched to operation voltages. For example, the emitter can be biased to +8 kV to +12 kV with the emitter power supply 124. Further, the extractor 132 can be biased to −3 kV to −7 kV with the extractor power supply 134, and the anode 152 may be biased to potential close to ground potential. According to some embodiments, which can be combined with other embodiments described herein, the anode power supply 154 can be omitted for embodiments, for which the anode 152 remains on ground at all times. The trapping electrode 142 remains biased to, for example, +3 kV to +9 kV. The particles 202 remain trapped at the trapping electrode. The electrical field at the trapping electrode remains negative at the surface of the trapping electrode, also when the other voltages in the gun are switched on.

According to some embodiments, which can be combined with other embodiments described herein, relative potentials of the charged particle gun can be provided as follows: the operative emitter potential is −0.3 kV to −2 kV, a potential of the extractor electrode is +5 kV to +10 kV, the operative anode potential is +10 kV to +100 kV, and a potential of the suppressor electrode is −0.6 kV to −2.3 kV, a potential of the specimen being at ground, wherein the relative potentials can be commonly shifted, particularly by about −15 kV to −45 kV.

According to one embodiment, a method of operating a charged particle gun is provided. The method includes providing an emitter at a first emitter potential within the charged particle gun and providing a trapping electrode at a first electrode potential within the charged particle gun, wherein the first emitter potential and the first electrode potential is provided to have an electrical field of essentially zero at the emitter and at the trapping electrode (see, e.g. operation 602). The method further includes switching the trapping electrode from the first electrode potential to a second electrode potential different from the first electrode potential to generate an electrostatic trapping field at the trapping electrode (see, e.g. operation 602). After switching the trapping electrode from the first electrode potential to the second electrode potential, an electrostatic emission field at the emitter is switched on (see, e.g. operation 606).

According to embodiments, a method of operating a charged particle gun is provided. The method includes providing an emitter at a first emitter potential within the charged particle gun and providing a trapping electrode at a first electrode potential within the gun housing (see, e.g. operation 602). The method further includes switching the trapping electrode from the first electrode potential to a second electrode potential different from the first electrode potential (see, e.g. operation 602). After switching the trapping electrode, the method further includes switching the emitter to an operative emitter potential of the charged particle gun, the operative potential being different from the first emitter potential. According to yet further optional modifications and implementations, other components of the charged particle gun 102 may be included with a similar switching behavior. For example, the method may include providing an anode at a first anode potential and providing a gun housing of the charged particle gun at a first housing potential. After switching the trapping electrode, the anode can be switched to an operative anode potential of the charged particle gun, the operative anode potential being different from the first anode potential.

According to some embodiments, which can be combined with other embodiments described herein, the first emitter potential, the first electrode potential, the first anode potential, and the first gun housing potential can correspond to the respective potentials during maintenance.

Returning back to FIGS. 1A and 1B, the anode 152 is provided between trapping electrode 142 and the axis 123. The electron beam travels along the axis 123. Accordingly, the anode shields the electron beam from the electric field provided by the trapping electrode.

According to some embodiments, which can be combined with other embodiments described herein, the geometry of the trapping electrode and/or the design of the trapping electrode is chosen to reduce or avoid influencing the parts of the electrons in the beam path, i.e. the electron beam traveling essentially along the axis. According to some embodiments, which can be combined with other embodiments described herein, a rotationally symmetric design of the trapping electrode is advantageous. The potentially remaining influence on the electrons will be rotationally symmetric.

According to some embodiments, which can be combined with other embodiments described herein, a shielding element can be provided for shielding the electrostatic field of the trapping electrode. As described above, the anode or another beam guiding element may serve as the shielding element. Yet, a further shielding element can be provided.

Figure 5:
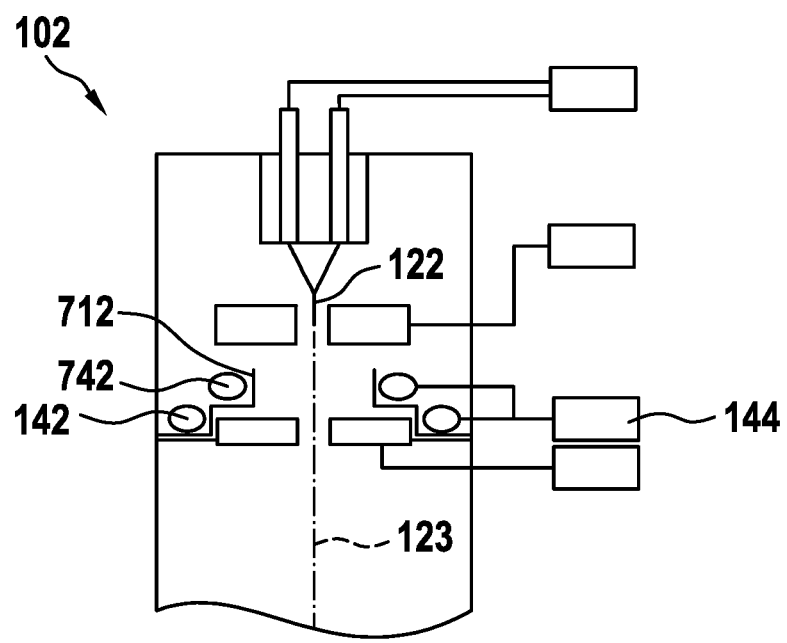
FIG. 5 shows a schematic view of a portion of a charged particle beam device according to embodiments described herein and including an electrode for trapping particles and a further trapping electrode.

FIG. 5 shows an embodiment according to the present disclosure, wherein a shielding element 712 is provided to shield the electrons along the beam path. Further, the trapping electrode 142, i.e. a first trapping electrode, is provided and a second trapping electrode is provided. The trapping electrode 142 and the further trapping electrode 742 can be positioned at different positions along the axis 123. According to yet further additional or alternative implementations, the further trapping electrode 742 electrode may be provided with an outer diameter different from the trapping electrode 142, may be provided with an inner diameter different from the trapping electrode 142, and/or may have a different cross-sectional shape.

According to some embodiments, which can be combined with other embodiments described herein, the design and/or location of the one or more trapping electrodes can be chosen so that the electric field remains negative at the surface of the one or more trapping electrodes, also when the other voltages in the charged particle gun 102 are switched on.

In order to have contamination particles trapped at the one or more trapping electrodes, even if the other voltages are switched on for operation of the charged particle gun, the one or more trapping electrodes can have a curved surface in the cross-section parallel to the axis 123, for example, the cross-section shown in FIG. 7, and particularly the cross-section of one side of a ring-shaped trapping electrode. For example, the one or more trapping electrodes can be shaped such that the electric field remains at the same polarity for the different voltages of the emitter during maintenance, ramping up, and operation. According to some embodiments, which can be combined with other embodiments described herein, the trapping electrode can have a radius of curvature of 20 mm or below, particularly 10 mm or below. The radius of curvature influences the field strength of the electrostatic trapping field. Accordingly, the smaller the radius of curvature is, the smaller the second electrode potential generating the electrostatic trapping field may be. With respect to the maximum radius of curvature it is understood that the radius of curvature of a flat plane or a line is infinitely large, particularly much large than 20 mm.

Figure 3:
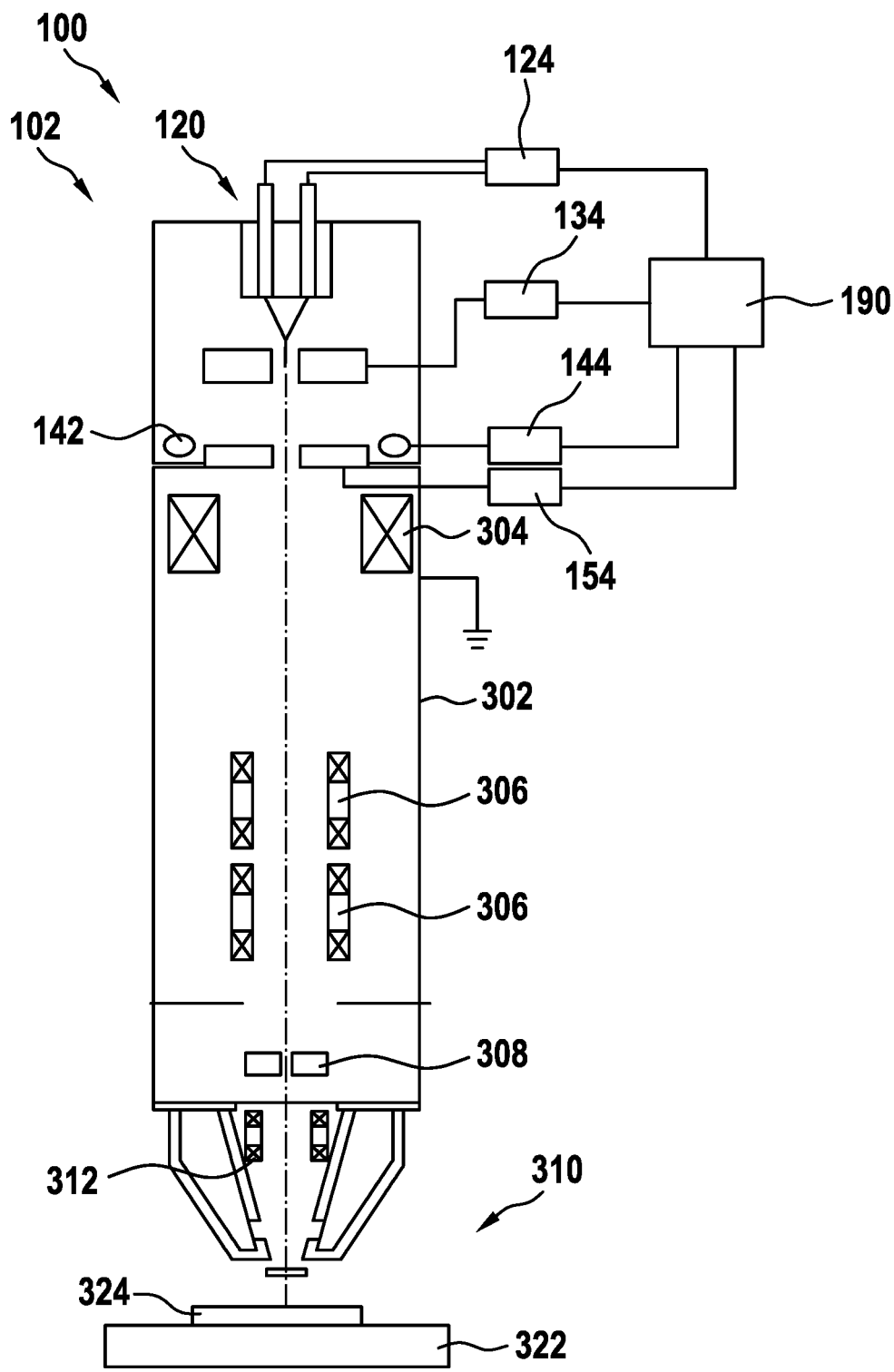
FIG. 3 shows a schematic view of a charged particle beam device including a particle trap according to embodiments of the present disclosure.
Figure 4:
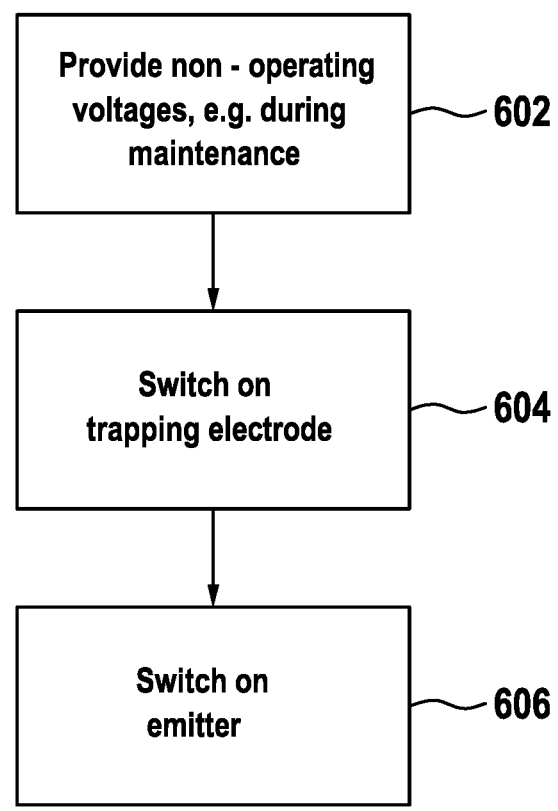
FIG. 4 shows a flowchart of a method of operating a portion of a charged particle beam device according to embodiments of the present disclosure.

FIG. 3 shows a schematic view of a charged particle beam device 100 according to embodiments described herein. The charged particle beam device 100 can be an electron microscope, such as a scanning electron microscope (SEM). The charged particle beam device 100 includes a charged particle gun according to embodiments of the present disclosure. The charged particle beam device 100 further includes a column 302 for guiding the electron beam onto the specimen 324. The specimen 324 can be supported on a specimen table 322.

The charged particle beam device 100 includes the charged particle source 120 configured to emit a (primary) charged particle beam and a trapping electrode 142 as described herein. The controller 190 can control the voltages during ramping up of the charged particle gun 102 and during operation of the charged particle gun. As described above, before the charged particle source 120 is operated, a trapping potential is provided by the trapping power supply 144 to the trapping electrode 142.

The charged particle beam device may include a condenser lens arrangement 304 and alignment deflectors 306 for aligning the charged particle beam to the axis 123. According to some embodiments, which can be combined with other embodiments described herein, the axis 123 can be the optical axis of the objective lens 310.

FIG. 3 shows a straight vision system. The alignment deflectors 306 may also be utilized to provide a non-straight vision system. For example, a first deflector can be utilized to generate an inclination for the charged particle beam and a second deflector can be utilized to re-direct the beam to be perpendicular to the surface of the specimen 324. Particularly for the magnetic second deflector, separation between the primary electron beam and a signal beam can be provided.

As shown in FIG. 3, an objective lens 310 focuses the electron beam on the specimen 324. One or more scanning deflectors 312 provided within the objective lens or upstream of the objective lens can scan the electron beam over the specimen for image generation. Signal particles generated upon impingement of the primary electron beam on the specimen can be detected by the detector 308. As shown in FIG. 3, the detector can be an on-axis detector. Additionally or alternatively, an off-axis detector can be provided.

According to some embodiments, which can be combined with other embodiments described herein, the objective lens 310 can be an electrostatic magnetic compound lens, particularly having an electrostatic lens that reduces the energy within the column from a high energy within the column to a lower landing energy.

FIG. 3 shows a single beam scanning electron microscope. According to yet further embodiments, which can be combined with other embodiments described herein, embodiments of the present disclosure including a trapping electrode may also be utilized for multi-beam scanning electron microscopes or multi-beam lithography systems. A multi-beam charged particle beam device or a multi-beam system can be provided with a magnetic lens, an electrostatic magnetic compound lens, or with an electrostatic lens having individual lens openings for the individual beamlets of the multi-beam system.

According to one embodiment, a charged particle beam device is provided. The charged particle beam device includes a charged particle gun according to any of the embodiments of the present disclosure and a charged particle beam column for guiding the charged particle on a specimen.

In light of the above, a plurality of embodiments can be provided. The embodiments are inter alia as follows.
Embodiment 1: A method of operating a charged particle gun, including: providing an emitter at a first emitter potential within the charged particle gun and providing a trapping electrode at a first electrode potential within the charged particle gun, wherein the first emitter potential and the first electrode potential is provided to have an electrical field of essentially zero at the emitter and at the trapping electrode; switching the trapping electrode from the first electrode potential to a second electrode potential different from the first electrode potential to generate an electrostatic trapping field at the trapping electrode; and after switching the trapping electrode from the first electrode potential to the second electrode potential, switching on an electrostatic emission field at the emitter.

Embodiment 2: The method according to embodiment 1, wherein switching on the electrostatic emission field includes: switching the emitter from the first emitter potential to an operative emitter potential.

Embodiment 3: The method according to embodiment 2, further including: providing an anode at a first anode potential; providing a gun housing of the charged particle gun at a first housing potential; and after switching the trapping electrode, switching the anode to an operative anode potential of the charged particle gun, the operative anode potential being different from the first anode potential.

Embodiment 4: The method of embodiment 3, wherein the first emitter potential, the first electrode potential, the first anode potential, and the first housing potential correspond to respective potentials during maintenance.

Embodiment 5: The method of any of embodiments 1 to 4, wherein switching of the trapping electrode causes particles in the gun housing to be attracted to the trapping electrode and away from the emitter or other components in the gun chamber.

Embodiment 6: The method of any of embodiments 1 to 5, wherein the second electrode potential provides a field strength at the trapping electrode to trap particles on the trapping electrode after switching the emitter to the operative emitter potential.

Embodiment 7: The method of to any of embodiments 1 to 6, wherein the electrostatic trapping field has a first direction before switching on the electrostatic emission field at the emitter and after switching on the electrostatic emission field at the emitter.

Embodiment 8: The method of to any of embodiments 1 to 7, wherein relative potentials of the charged particle gun can be provided as follows: the operative emitter potential is −0.3 kV to −2 kV, a potential of the extractor electrode is +5 kV to +10 kV, the operative anode potential is +10 kV to +100 kV, and a potential of the suppressor electrode is −0.6 kV to −2.3 kV, a potential of the specimen being at ground, wherein the relative potentials can be commonly shifted, particularly by about −15 kV to −45 kV.

Embodiment 9: A charged particle gun for a charged particle beam device, including: a gun housing; an emitter provided in the gun housing, the emitter being configured to emit a charged particle beam along an axis; an emitter power supply connected to the emitter; a trapping electrode provided in the gun housing, the trapping electrode at least partially surrounding the axis; a trapping power supply connected to the trapping electrode; and a shielding element shielding an electrostatic field of the trapping electrode from the axis during operation of the gun housing.

Embodiment 10: The charged particle gun according to embodiment 9, further including: an extractor electrode within the gun housing; a suppressor electrode within the gun housing; and an anode at least partially within the gun housing.

Embodiment 11: The charged particle gun according to embodiment 10, wherein the shielding element is provided by the anode provided at least partially between the trapping electrode and the axis.

Embodiment 12: The charged particle gun according to any of embodiments 9 to 11, further including: a controller including: a processor and a memory storing instructions that, when executed by the processor, cause the charged particle gun to perform a method according to any of embodiments 1 to 6.

Embodiment 13: The charged particle gun according to any of embodiments 9 to 12, wherein the trapping electrode is rotationally symmetric, particularly ring-shaped.

Embodiment 14: The charged particle gun according to any of embodiments 9 to 13, wherein the trapping electrode has a curved surface in a cross-section parallel to the axis.

Embodiment 15: The charged particle gun according to any of embodiments 9 to 14, wherein the trapping electrode is shaped such that the electrostatic field remains at the same polarity for different voltages of the emitter during maintenance, ramping up, and operation.

Embodiment 16: The charged particle gun according to any of embodiments 9 to 15, wherein the trapping electrode has a radius of curvature of 20 mm or below.

Embodiment 17: The charged particle gun according to any of embodiments 9 to 16, further including: a further trapping electrode, particularly at a position along the axis different from the trapping electrode.

Embodiment 18: The charged particle gun according to any of embodiments 9 to 17, wherein the emitter is a field emitter.

Embodiment 19: A charged particle beam device, including: a charged particle gun according to any of embodiments 9 to 16; and a charged particle beam column for guiding charged particles on a specimen.

In light of the above, one or more of the following advantages can be provided. Arcing during ramping up of a charged particle gun can be reduced. Accordingly, the risk of destruction of an emitter, particularly a field emitter, can be reduced. Further, cleaning effort for ramping up of a charged particle gun can be reduced. Thus, maintenance can be accelerated and/or uptime of the system can be increased. Accordingly, the overall throughput of a charged particle beam device can be improved.

While the foregoing is directed to embodiments of the disclosure, other and further embodiments of the disclosure may be devised without departing from the basic scope thereof, and the scope thereof is determined by the claims that follow.

The invention claimed is:

1. A charged particle gun for a charged particle beam device, comprising:
 a gun housing;
 an emitter provided in the gun housing, the emitter being a field emitter configured to emit a charged particle beam along an axis;
 an emitter power supply connected to the emitter;
 a trapping electrode provided in the gun housing, the trapping electrode at least partially surrounding the axis;
 a trapping power supply connected to the trapping electrode; and
 a shielding element shielding an electrostatic field of the trapping electrode from the axis during operation of the gun housing.

2. The charged particle gun according to claim 1, further comprising:
 an extractor electrode within the gun housing;
 a suppressor electrode within the gun housing; and
 an anode at least partially within the gun housing.

3. The charged particle gun according to claim 2, wherein the shielding element is provided by the anode provided at least partially between the trapping electrode and the axis.

4. The charged particle gun according to claim 1, further comprising:
 a controller comprising: a processor and a memory storing instructions that, when executed by the processor, cause the charged particle gun to perform a method comprising:
  providing an emitter at a first emitter potential within the charged particle gun and providing a trapping electrode at a first electrode potential within the charged particle gun, wherein the first emitter potential and the first electrode potential is provided to have an electrical field of essentially zero at the emitter and at the trapping electrode;
  switching the trapping electrode from the first electrode potential to a second electrode potential different from the first electrode potential to generate an electrostatic trapping field at the trapping electrode; and
  after switching the trapping electrode from the first electrode potential to the second electrode potential, switching on an electrostatic emission field at the emitter.

5. The charged particle gun according to claim 1, wherein the trapping electrode is rotationally symmetric.

6. The charged particle gun according to claim 1, wherein the trapping electrode has a curved surface in a cross-section parallel to the axis.

7. The charged particle gun according to claim 1, wherein the trapping electrode is shaped such that the electrostatic field remains at the same polarity for different voltages of the emitter during maintenance, ramping up, and operation.

8. The charged particle gun according to claim 1, wherein the trapping electrode has a radius of curvature of 20 mm or below.

9. The charged particle gun according to claim 1, further comprising:
 a further trapping electrode at a position along the axis different from the trapping electrode.

10. The charged particle gun according to claim 1, wherein the emitter is a field emitter.

11. The charged particle gun according to claim 1, wherein the shielding element is positioned at least partially between the trapping electrode and the axis in a cross-section perpendicular to the axis.

12. The charged particle gun according to claim 1, wherein the shielding element is configured to shield the electrostatic field of the trapping electrode from the axis to avoid influence of the electrostatic field on the charged particle beam along the axis.

13. A charged particle beam device, comprising:
 a charged particle gun for the charged particle beam device, the charged particle gun, comprising:
  a gun housing;
  an emitter provided in the gun housing, the emitter being a field emitter configured to emit a charged particle beam along an axis;
  an emitter power supply connected to the emitter;
  a trapping electrode provided in the gun housing, the trapping electrode at least partially surrounding the axis;
  a trapping power supply connected to the trapping electrode; and
  a shielding element shielding an electrostatic field of the trapping electrode from the axis during operation of the gun housing;
 the charged particle beam device further comprising:
  a charged particle beam column for guiding charged particles on a specimen.

14. The charged particle beam device according to claim 13, wherein the trapping electrode has a radius of curvature of 20 mm or below.

15. The charged particle beam device according to claim 13, wherein the shielding element is positioned at least partially between the trapping electrode and the axis in a cross-section perpendicular to the axis.

16. The charged particle beam device according to claim 13, wherein the shielding element is configured to shield the electrostatic field of the trapping electrode from the axis to avoid influence of the electrostatic field on the charged particle beam along the axis.

* * * * *